United States Patent
Sekiguchi

(10) Patent No.: US 7,864,828 B2
(45) Date of Patent: Jan. 4, 2011

(54) LASER DEVICE

(75) Inventor: Ryota Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/474,903

(22) Filed: May 29, 2009

(65) Prior Publication Data

US 2009/0310639 A1 Dec. 17, 2009

(30) Foreign Application Priority Data

Jun. 16, 2008 (JP) ............................... 2008-156583

(51) Int. Cl.
*H01S 5/34* (2006.01)
*H01S 5/00* (2006.01)
(52) U.S. Cl. .................. 372/45.01; 372/43.01; 977/951
(58) Field of Classification Search ............. 372/43.01, 372/45.01; 977/951
See application file for complete search history.

(56) References Cited

U.S. PATENT DOCUMENTS

| | | | | |
|---|---|---|---|---|
| 6,055,254 | A | 4/2000 | Capasso et al. | ................ 372/45 |
| 7,386,024 | B2 | 6/2008 | Sekiguchi et al. | ...... 372/45.012 |
| 7,693,198 | B2 | 4/2010 | Sekiguchi et al. | ........ 372/45.01 |
| 2006/0039431 | A1* | 2/2006 | Sekiguchi et al. | ........ 372/44.01 |
| 2009/0161715 | A1 | 6/2009 | Asada et al. | ............. 372/45.01 |

FOREIGN PATENT DOCUMENTS

| JP | 2000-101201 A | 4/2000 |
|---|---|---|
| JP | 2006-032691 A | 2/2006 |

OTHER PUBLICATIONS

R. Köhler, et al., "Terahertz semiconductor-heterostructure laser," Nature, vol. 417, pp. 156-159, May 2002.

\* cited by examiner

*Primary Examiner*—Minsun Harvey
*Assistant Examiner*—Michael Carter
(74) *Attorney, Agent, or Firm*—Fitzpatrick, Cella, Harper & Scinto

(57) ABSTRACT

A cascade laser device, including a multilayer film structure with a multiple quantum well including a potential barrier and a quantum well; and an electric field applying portion for applying an electric field to the multilayer film structure. The multilayer film structure includes at least two first regions and a second region. The second region is sandwiched between the two first regions; each of the first regions includes multiple sub-bands. When the electric field is applied, carriers are transported from a sub-band in the higher energy quantum well to a sub-band in the lower energy quantum well via the potential barrier in the first regions by tunneling permitted by interaction with light. The second region is thinner than twice a skin depth of the light and includes at least a film having an energy band. The carriers are subjected to energy relaxation in the energy band.

7 Claims, 8 Drawing Sheets

LASER DEVICE

BACKGROUND OF THE INVENTION

1. Field of the Invention

The present invention relates to an optical semiconductor device and a semiconductor laser device for frequencies within a frequency range of millimeter waves to terahertz waves (30 GHz or more to 30 THz or less). More particularly, the present invention relates to a cascade laser device which has a so-called cascade laser structure and can be used in such an application as laser oscillation, optical amplification, and photodetection.

2. Description of the Related Art

As a new type of semiconductor laser, a semiconductor laser named a quantum cascade laser and based on sub-band transition of a carrier in the same energy band in a conduction band or a valance band. The oscillation wavelength of the quantum cascade laser depends on an energy interval between two sub-bands in regard to optical transition. Thus, oscillation wavelengths may be selected from a wide spectral region (from middle infrared region to terahertz band). As disclosed in Nature. Vol. 417, 156 (2002), at first, it has been substantiated that a configuration in which an oscillation wavelength of 4.2 μm in a middle infrared region is selected enables realization of such a semiconductor laser. In a proposal of Japanese Patent Application Laid-Open No. 2000-101201 which offers a different sub-band configuration, laser oscillation at 7.2 μm in a middle infrared region is achieved. A recent demand for electromagnetic resources of a terahertz band, which is considered useful for biosensing, has led to developments of long-wavelength lasers which select oscillation wavelengths of a longer wavelength than that in a middle infrared region. Japanese Patent Application Laid-Open No. 2006-032691 discloses a laser device of about 120 μm (about 2.5 THz) in a terahertz band.

Referring to FIG. 4, a configuration of a quantum cascade laser is outlined.

FIG. 4 illustrates a part of a conduction band structure when a designed electric field is applied to the quantum cascade laser. An active region 410 includes, for example, barriers 441, 443 and 445 and quantum wells 442, 444 and 446. These components constitute sub-bands 411, 412 and 413 in the active region 410. A relaxation region 420 includes barriers 451, 453, 455 and 457 and quantum wells 452, 454, 456 and 458. These components constitute a mini-band 421 formed by bundling up multiple sub-bands. Thus, the quantum cascade laser has such a feature that a plurality of active and relaxation regions 410 and 420 are alternately repeated. An active region 430 is a next active region in the repetition.

When the designed electric field is applied to the quantum cascade laser, current flows as follows. Electrons cause optical transition 401 from the sub-band 411 to the sub-band 412 in the active region 410 to emit light of a wavelength equivalent to the energy interval between the sub-bands 411 and 412. Subsequently, the electrons of the sub-band 412 of the active region 410 pass through the sub-band 413 by optical phonon scattering 402 and the like to achieve population inversion between the sub-bands 411 and 412, and are extracted to the relaxation region 420. The electrons that have passed through the mini-band 421 of the relaxation region 420 are injected to the next active region 430 to cause the same optical transition as that of the active region 410.

As a configuration of a relaxation region in such a typical quantum cascade laser, a configuration that uses a mini-band as described above has been disclosed. The quantum cascade laser in Japanese Patent Application Laid-Open No. 2006-032691 is an example where the active region is provided with no relaxation mechanism. By using the sub-band for the relaxation region, population inversion is achieved between the two sub-bands involved in optical transition in the active region.

As described above, the conventional quantum cascade laser uses the mini-band formed by bundling multiple sub-bands of equal energy or the sub-band for the relaxation region to obtain cascade-connection of the active regions.

Under these technical circumstances, the present invention has focused on the following point. That is, presence of a sub-band or a mini-band in the active region is necessary for utilizing transition between the sub-bands. However, the presence of a sub-band or a mini-band in the relaxation region is not always necessary if the following requirements are satisfied. A first requirement is that carrier extraction/injection can selectively be carried out for a sub-band in the active region. The second requirement is that multiple cascade-connected active regions can contribute to one electromagnetic mode.

SUMMARY OF THE INVENTION

Thus, an object of the present invention is to provide, from a viewpoint different from that of the conventional art using a mini-band or a sub-band in the relaxation region, a cascade laser device formed into a structure which enables selective carrier extraction/injection for a sub-band of an active region, and still enables multiple active regions to contribute to one electromagnetic mode in synchronization.

A cascade laser device according to the present invention comprises a multilayer film structure with a multiple quantum well including a potential barrier and a quantum well; and an electric field applying portion for applying an electric field to the multilayer film structure, and the multilayer film structure includes at least two first regions and a second region, the second region being sandwiched between the two first regions. Each of the first regions includes multiple sub-bands, and when an electric field is applied, carriers are transported from a sub-band in the higher energy quantum well to a sub-band in the lower energy quantum well via the potential barrier in the first regions by tunneling permitted by interaction with light. Further, the second region is thinner than twice a skin depth (detailed below) of the light and includes at least a film having an energy band (film including no discrete sub-band). The carriers are injected to the lower energy first region, and the carriers are subjected to energy relaxation in the energy band.

A cascade laser apparatus according to the present invention comprises: the cascade laser device described above; and a carrier injecting portion for injecting carriers to the cascade laser device, and, when an electric field applying portion applies a predetermined electric field to the cascade laser device to inject carriers, a light is emitted ors absorbed.

With the second region having a relatively simple film configuration, the present invention can provide a cascade laser device having relatively high tolerance for manufacturing accuracy.

Further features of the present invention become apparent from the following description of exemplary embodiments with reference to the attached drawings.

BRIEF DESCRIPTION OF THE DRAWINGS

FIGS. 5A and 5B illustrate a band profile of a quantum well according to the first embodiment of the present invention, of which FIG. 5A illustrates a status of a sub-band not discrete in the quantum well; and FIG. 5B illustrates a status of a sub-band discrete in a quantum well not employed in the first embodiment of the present invention.

FIGS. 6A, 6B and 6C illustrate analysis examples of electromagnetic modes of a second region according to the first embodiment of the present invention, of which FIGS. 6A and 6B illustrates profiles of two electromagnetic modes; and FIG. 6C illustrates frequency dependence of each mode loss.

DESCRIPTION OF THE EMBODIMENTS

Figure 1:
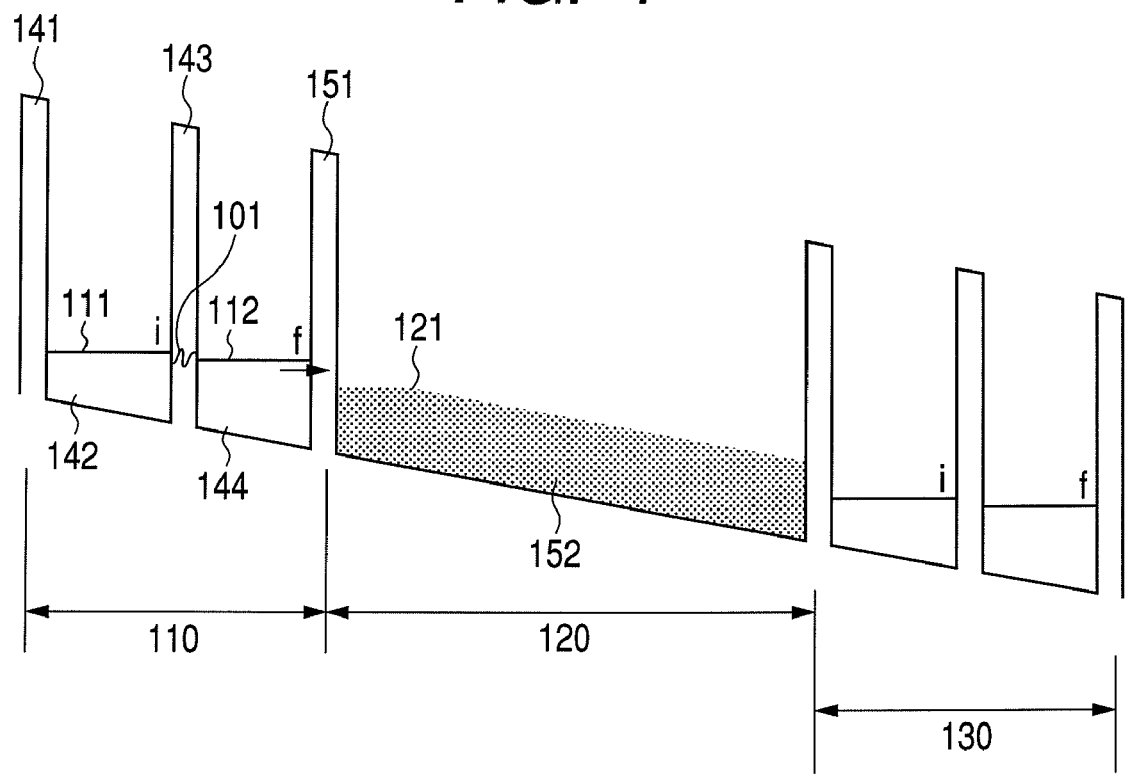
FIG. 1 illustrates a band profile of a conduction band structure of a cascade laser device according to a first embodiment of the present invention.

Exemplary embodiments of the present invention will be described. A cascade laser device of the present invention is basically configured as follows. The cascade laser device includes a multilayer film structure with a multiple quantum well including a potential barrier and a quantum well; and an electric field applying portion for applying an electric field to the multilayer film structure. The multilayer film structure includes at least three regions including two first regions and a second region sandwiched between these first regions. For example, the multilayer film structure has a structure where the first region and the second region are repeated in this order. The first region includes multiple sub-bands. When an electric field is applied, a carrier is transported from a sub-band in the higher energy quantum well to a sub-band in the lower energy quantum well via the potential barrier in the first region by tunneling permitted by interaction with light. The second region is thinner than twice a skin depth of the light and includes at least a film having an energy band. At the energy band, the carrier is subjected to energy relaxation. In other words, the second region includes a film thicker than a de Broglie wavelength (detailed below) so as to have an almost continuous energy band.

To inject more carriers to the lower energy first region, the film having the energy band favorably have carriers. With this configuration, when the electric field applying portion applies a predetermined electric field to the multiple quantum well, a current flows to the multiple quantum well, and the light is emitted or absorbed in the first region. If the cascade laser device has an optical resonator structure which resonates with the light emitted in the first region, the cascade laser device produces laser oscillation. If the multiple quantum well has a structure for absorbing light, the cascade laser device detects the light.

A cascade laser apparatus can be constructed by including the cascade laser device and a carrier injecting portion for injecting a carrier into the cascade laser device. In this case, when the electric field applying portion applies a predetermined electric field to the cascade laser device to inject a carrier, light is emitted or absorbed.

EMBODIMENTS

Hereinafter, referring to the drawings, specific embodiments of a cascade laser device of the present invention will be described.

First Embodiment

FIG. 1 illustrates a part of a band profile of a cascade laser device according to a first embodiment of the present invention. The cascade laser device of the exemplary embodiment includes a multilayer film structure including a multiple quantum well including potential barriers 141, 143 and 151 and quantum wells 142 and 144, and a film 152; and an electric field applying portion for tilting the band profile from higher energy to lower energy. For the electric field applying portion, a unit that includes electrodes to sandwich the multilayer film structure and connects these electrodes to a power source can be used (refer to second and third embodiments described below).

A first region 110 to which the present invention can be applied is disposed as in the case of an active region of a quantum cascade laser device, and simply called an active region accordingly hereinafter. The active region 110 includes, for example, two quantum wells 142 and 144 so that two sub-bands involved in optical transition can be arranged via a potential barrier. Thus, a sub-band 111 is formed in the quantum well 142, and a sub-band 112 is formed in the quantum well 144. The potential barrier 143 is disposed between these sub-bands for weak coupling (coupling where overlapping of wave functions is relatively small), and a predetermined electric field is applied. In this case, a carrier is transported from the sub-band in the higher energy quantum well 111 to the sub-band in the lower energy quantum well 112 by tunneling 101 permitted by interaction with light. This may be called photon-assisted tunneling or photon-assisted tunneling transition.

As illustrated in FIG. 1, when energy $E_i$ of a sub-band i111 is larger than energy $E_f$ of a sub-band f112, light (electromagnetic wave) of hν that satisfies the following expression (1) is emitted:

$$E_i - E_f = h\nu \tag{1}$$

In the expression, h denotes the Planck constant, and ν denotes the frequency of light (electromagnetic wave). The energy $E_i$ and the energy $E_f$ depend on a configuration of the multiple quantum well or magnitude of an electric field to be applied. Thus, the wavelength of light (electromagnetic wave), which is equivalent to the energy interval between the sub-bands i111 and f112, can be selected based on the configuration of the multiple quantum well and the magnitude of an applied electric field. For such photon-assisted tunneling transition, the frequency ν of light (electromagnetic wave) may be selected within a range of, for example, millimeter waves to terahertz waves (30 GHz to 30 THz).

A second region 120 to which the present invention can be applied is disposed as in the case of a relaxation region for cascade-connecting the active regions of the quantum cascade laser, and thus simply called a relaxation region hereinafter.

The relaxation region 120 includes a film 152 thicker than de Broglie wavelength of a carrier so as to have an almost continuous energy band 121. The de Broglie wavelength means a length where a quantum-mechanical nature of waves stands out. The film 152 thicker than the de Broglie wavelength may accordingly be a quantum well 152 which includes no discrete sub-band. The de Broglie wavelength of a carrier depends on the material thereof and type of the carrier. As for the de Broglie wavelength of the carrier, about 50 nm is an upper limit for an electron in a semiconductor, about 20 nm is an upper limit for a hole in a semiconductor, and about 1 nm is an upper limit for an electron in a metal. Thus, the thickness of the film 152 is set to, for example, 50 nm or more when the material of the film 152 is a semiconductor and the carrier is an electron.

Figure 5A:
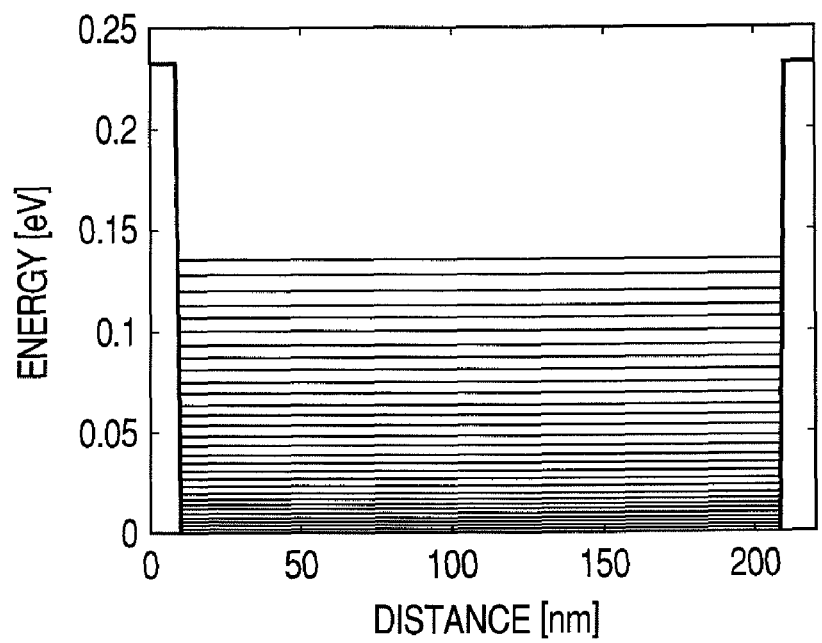
Figure 5B:
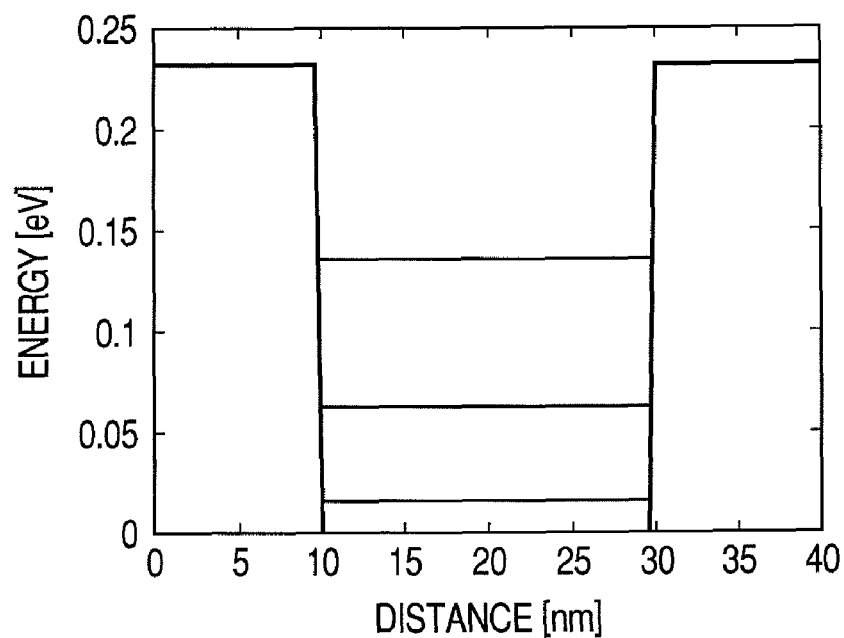

FIGS. 5A and 5B illustrate specific examples of a film or a quantum well 152. The figures illustrate a relationship of a film thickness and a solution (sub-band) of the Schrodinger equation when a GaAs-based semiconductor material is supposed and a carrier is an electron. FIG. 5A illustrates a relationship when the film thickness is 200 nm. The quantum well includes sub-bands formed at a high density to have an almost continuous energy band. The material of the film 152 as a base material originally has such energy band, thus forming a structure with a high robust, which is tolerance for manufacturing accuracy. FIG. 5B illustrates a relationship when the film thickness is 20.0 nm. The quantum well includes discrete sub-bands. The present invention does not employ the quantum well that includes the discrete sub-bands.

The energy band 121 includes a relaxation mechanism such as optical phonon scattering. Accordingly, in such a relaxation region 120, a carrier is subjected to energy relaxation to follow quasi-Fermi distribution in the energy band 121. The two sub-bands involved in the optical transition in the active region are spatially separated from each other, and hence the energy band 121 can selectively extract a carrier passing through only the sub-band in a lower energy quantum well 112 in the active region 110. Thus, even when the almost continuous energy band 121 is used for the relaxation region 120, population inversion can be achieved between the sub-bands i111 and f112. To inject more carriers into a next active region 130, the film 152 may include carriers. In other words, when the material of the film 152 is a semiconductor, the film 152 may be carrier-doped.

In the cascade laser device where the active and relaxation regions are repeated, light (electromagnetic wave) emitted in the active region 110 and light (electromagnetic wave) emitted in the active region 130 have to be synchronized with one electromagnetic mode as in the case of a coupled pendulum. The thickness $d_{120}$ of the relaxation region 120 is accordingly set smaller than a skin depth of the emitted light (electromagnetic wave). The skin depth $\delta$ is approximately given by the following expression (2), and depends on the frequency $\nu$ of light (electromagnetic wave), electric conductivity $\sigma$ of the energy band 121 in the relaxation region 120, and magnetic permeability $\mu$:

$$\delta = 1/(\pi \nu \mu \sigma)^{1/2} \quad (2)$$

Table 1 illustrates a relationship between electric conductivity of several semiconductor materials and metal materials and the skin depth $\delta$ using frequencies of electromagnetic waves as parameters.

TABLE 1

| Material | Concentration | Conductivity | $\delta$ (0.3 THz) μm | $\delta$ (1 THz) μm | $\delta$ (3 THz) μm |
|---|---|---|---|---|---|
| n-GaAs | $1 \times 10^{16}$ cm$^{-3}$ | $1.0 \times 10^1$ S/cm | 28 | 16 | 9.0 |
| n-GaAs | $1 \times 10^{18}$ cm$^{-3}$ | $4.8 \times 10^2$ S/cm | 4.2 | 2.3 | 1.3 |
| n-In$_{53}$Ga$_{47}$As | $1 \times 10^{17}$ cm$^{-3}$ | $1.3 \times 10^2$ S/cm | 8.1 | 4.4 | 2.6 |
| n-In$_{53}$Ga$_{47}$As | $1 \times 10^{18}$ cm$^{-3}$ | $9.6 \times 10^2$ S/cm | 3.0 | 1.6 | 0.9 |
| n-In$_{53}$Ga$_{47}$As | $1 \times 10^{19}$ cm$^{-3}$ | $6.4 \times 10^3$ S/cm | 1.1 | 0.63 | 0.36 |
| p-GaAs$_{51}$Sb$_{49}$* | $1 \times 10^{20}$ cm$^{-3}$ | $4.8 \times 10^2$ S/cm | 4.2 | 2.3 | 1.3 |
| Ni | — | $1.5 \times 10^5$ S/cm | 0.24 | 0.13 | 0.08 |
| Au | — | $4.1 \times 10^5$ S/cm | 0.14 | 0.08 | 0.05 |
| Ag | — | $6.2 \times 10^5$ S/cm | 0.12 | 0.06 | 0.04 |

For the semiconductor materials, the effective mass and mobility in O. Madelung, "Semiconductors-Basic Data (2nd Rev. Ed.)", Springer (1996) were referred to. Electric conductivity dependent on carrier concentration is derived by the Drude model known to those skilled in the art. For GaAsSb marked by '*', the electric conductivity of J. Crystal Growth, Vol. 221, 59 (2000) was referred to. For electric conductivity of the metal materials, David M. Pozar, "Microwave Engineering (3rd Ed.)", published by John Wiley & Sons, Inc. (2005) was referred to. By the expression (2), the skin depth is smaller as the frequency of light (electromagnetic wave) is higher. For example, as can be understood from Table 1, in from millimeter waves to terahertz waves (30 GHz to 30 THz), all the materials have appropriate thicknesses. In short, such thicknesses allow sufficiently accurate manufacturing.

Figure 6A:
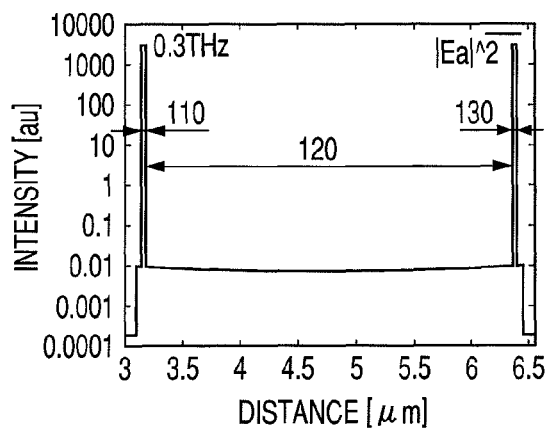
Figure 6B:
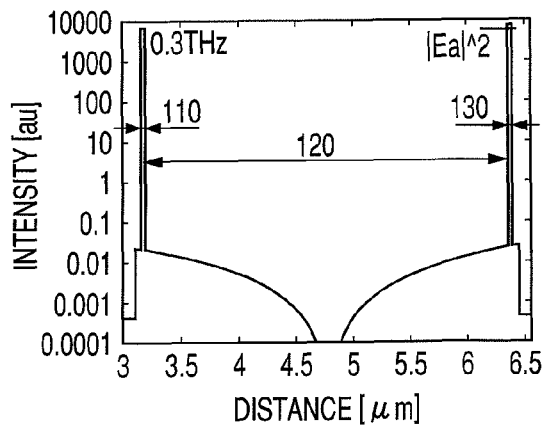
Figure 6C:
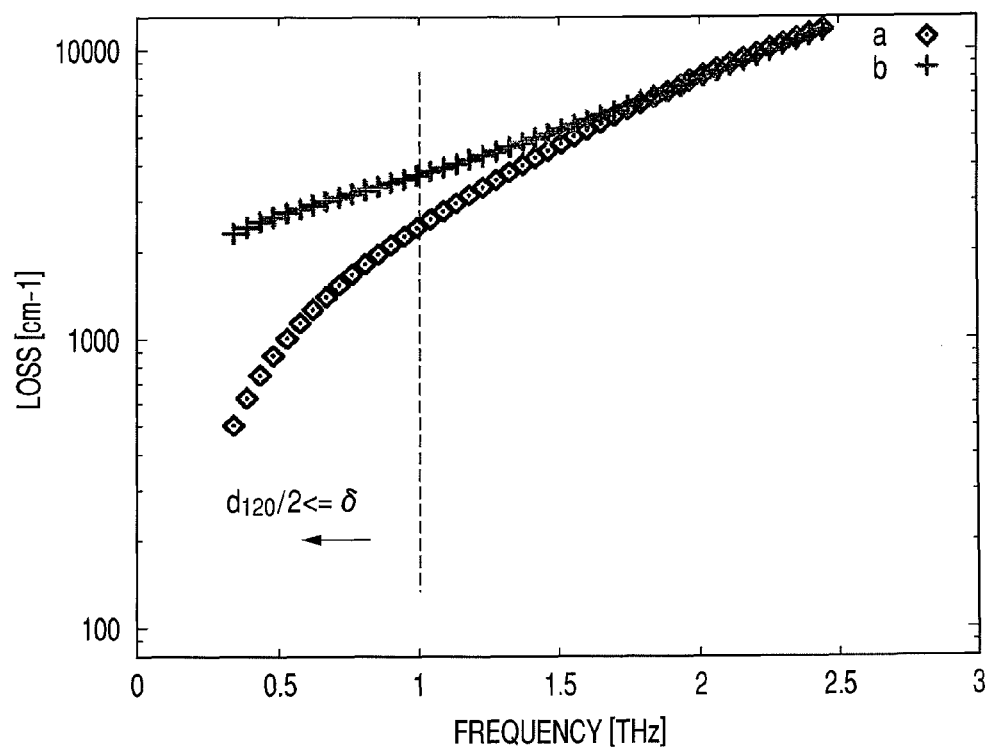

FIGS. 6A to 6C illustrate more specific examples of the relaxation region 120. For example, each of the figures illustrate a relationship between an electromagnetic mode and a frequency when the active regions 110 and 130 are made of InGaAs-based semiconductor materials and a material of the film 152 of the relaxation region 120 sandwiched between the active regions is made of n-InGaAs of electron concentration $1 \times 10^{18}$ cm$^{-3}$ (thickness of 3200 nm). FIG. 6A illustrates a profile of an electromagnetic mode 'a' at 0.3 THz in the active regions 110 and 130 and the relaxation region 120. FIG. 6B illustrates a profile of an electromagnetic mode 'b' at 0.3 THz in the active regions 110 and 130 and the relaxation region 120. FIG. 6C illustrates frequency dependence of mode losses of the electromagnetic mode 'a' (FIG. 6A) where the active region 110 and the relaxation region 120 are in the same phase and the electromagnetic mode 'b' (FIG. 6B) where the active region 110 and the relaxation region 120 are not in the same phase. As obvious from FIG. 6C, the difference in mode loss is greater between the electromagnetic modes 'a' and 'b' especially at a frequency of about 1 THz or less. It is because of an exponential relationship between the depth $d_{120}$ of the relaxation region 120 and the skin depth $\delta$.

When the relationship is represented by an expression, because the relaxation region 120 is sandwiched between the active regions 110 and 130, a half of the thickness of the relaxation region 120 is approximately equal to the skin depth or less. When the following expression (3) is established, the difference in mode loss is greater between the modes 'a' and 'b':

$$d_{120}/2 \leq \delta(\nu) \quad (3)$$

In this specific example, the frequency band of light (electromagnetic wave) at the skin depth of the right side satisfying the expression (3) is 1 THz or less, which corresponds to the above 1 THz or less. Selecting the frequency band of light (electromagnetic wave) in the skin depth of the right side so as to satisfy the expression (3) enables the active regions 110 and 130 to contribute to the electromagnetic mode 'a'. In other words, selecting the thickness of the left side so as to satisfy the expression (3) enables the active regions 110 and 130 to contribute to the electromagnetic mode 'a'. For a calculation method of FIG. 6A, a finite element method solver of Maxwell's equation is used. For a calculation model, the multilayer film structure is modeled one-dimensionally in a film thickness direction, and for carrier concentration it is reflected to the Drude model.

The cascade laser device according to this embodiment operates as follows. First, when the electric field applying portion applies a predetermined electric field, carriers cause photon-assisted tunneling transition 101 from the sub-band 111 to the sub-band 112 in the active region 110 to emit light (electromagnetic wave) with a frequency equivalent to the energy interval between the sub-bands 111 and 112. Then, the carriers in the sub-band 112 of the active region 110 are extracted to the relaxation region 120. The electrons that have passed through the relaxation region 120 are injected to the next active region 130 to cause the same photon-assisted tunneling transition as that of the active region 110. In the almost continuous energy band 121 of the relaxation region 120, the carriers follow quasi-Fermi distribution to achieve population inversion between the sub-bands 111 and 112. Lastly, the multiple active regions 110 and 130 that originally emit light (electromagnetic wave) individually are synchronized with each other to emit light in one electromagnetic mode.

When an optical resonator structure is provided to resonate the light (electromagnetic wave) emitted in the active regions 110 and 130, the device operates as a cascade laser device which produces laser oscillation. For the optical resonator structure, a surface plasmon waveguide having end surfaces or the like is preferably used. Not limited to this waveguide, however, other optical resonator structures (cavity resonator, and DFB resonator) can be used. Depositing nonreflecting coatings on the end surfaces to reduce reflectance of the end surfaces and resonation causes light entered from one end surface to be amplified and output from the other end surface, thereby enabling the device to operate as a cascade amplifying device. The device can also operate as a cascade light emitting device which emits light (electromagnetic wave) without including any optical resonator structure.

The cascade laser device can perform the aforementioned operations even in a configuration in which active and relaxation regions 110 and 120 are repeated multiple times. Thus, the configuration of the multilayer film structure of the cascade laser device of this embodiment can be easily extended to the configuration in which the active and relaxation regions 110 and 120 are repeated multiple times.

For the multilayer film structure, for example, GaAs/AlGaAs on a GaAs substrate or InGaAs/InAlAs or InGaAs/AlAs on an InP substrate, which are semiconductor materials, may be used. Not to limited to those material, however, a semiconductor multilayer film structure can be formed by using InAs/AlAsSb on an InAs substrate, InGaAs/AlGaAsSb on an InP substrate, or Si/SiGe on a Si substrate. Needless to say, not limited to the semiconductor material, a multilayer film structure by semiconductor/metal heterojunction or a multilayer film structure by metal heterojunction may be employed.

According to this embodiment, the relaxation region is provided with an energy band which needs no sub-band designing, thereby realizing a structure with a higher robust, which is tolerance for manufacturing accuracy, than a conventional quantum cascade laser. In the active region, the potential barrier separates two sub-bands involved in optical transition into higher energy and lower energy. Thus, carrier extraction/injection can be selectively carried out even when a continuous energy band is used in the relaxation region. Setting the thickness of the relaxation region smaller than the skin depth of light (electromagnetic wave) enables multiple active regions to be synchronized with one another to contribute to one laser oscillation mode, for example, when the optical resonator structure is provided.

As a result, the present invention can provide a cascade laser device which has such a structure that the relaxation region has a relatively simple film configuration and the tolerance for manufacturing accuracy is relatively high, can perform carrier extraction/injection selectively with respect to sub-bands of an active region and can synchronize multiple active regions to contribute to one electromagnetic mode. Improvement in the characteristics due to high robust can be expected. For example, when the cascade laser device is used as a laser oscillation device, light emission efficiency can be increased.

Second Embodiment

Figure 2A:
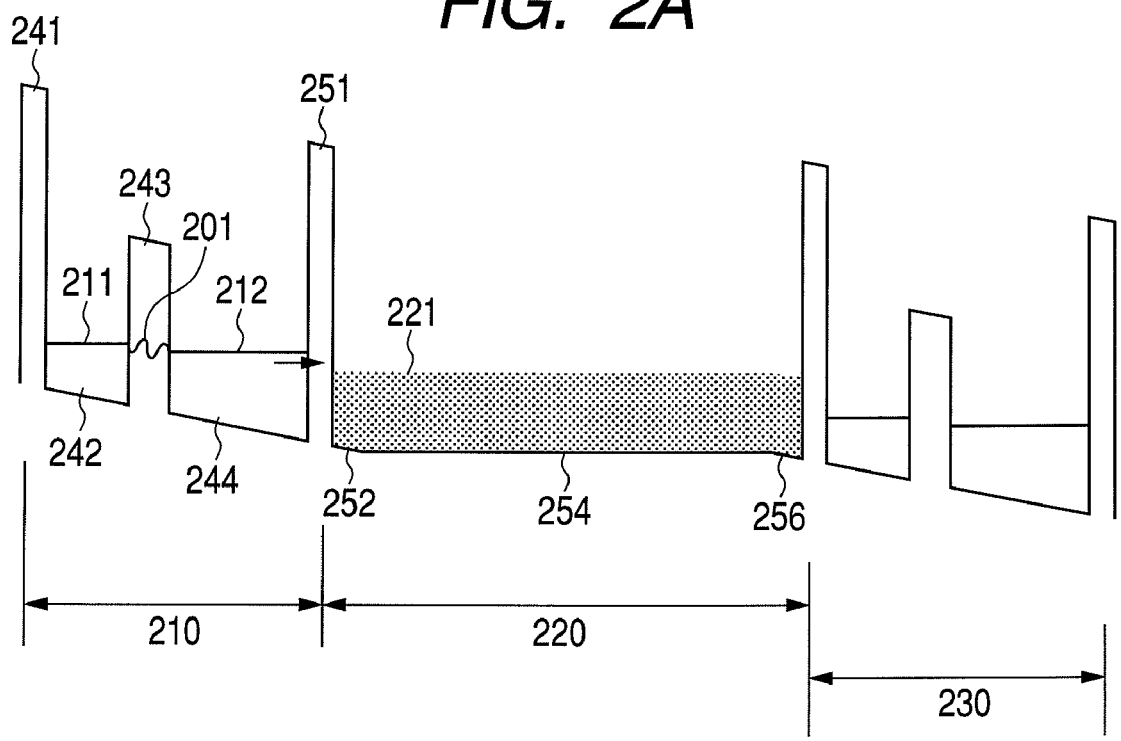
FIG. 2A illustrates a band profile of a conduction band structure of a cascade laser device according to a second embodiment of the present invention.
Figure 2B:
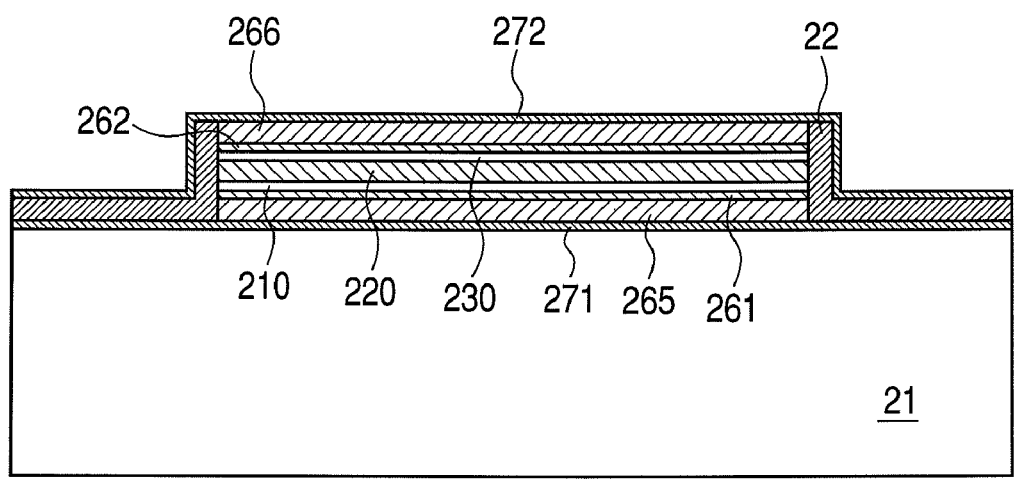
FIG. 2B illustrates a cross-sectional structure of the cascade laser device of the second embodiment of the present invention.

FIGS. 2A and 2B illustrate a cascade laser device according to a second embodiment of the present invention. FIG. 2A illustrates a conduction band structure of this embodiment, in which a relaxation region 220 includes a film 254 including no discrete sub-bands and spacers 252 and 256.

In this embodiment, a multilayer film structure includes a semiconductor multilayer film structure which includes a multiple quantum well as described below. In the multiple quantum well, lattice-matching InGaAs on an InP substrate is used for the well layer, and lattice-matching InAlAs or non lattice-matching AlAs is used for the barrier layer. Specifically, the respective layers form the following semiconductor multilayer film structure from the higher energy to the lower energy.

AlAs 1.3 nm (241)/InGaAs 5.6 nm (242)/InAlAs 2.6 nm (243)/InGaAs 7.6 nm (244)/AlAs 1.3 nm (251)/InGaAs 5.0 nm (252)/n-InGaAs 400 nm (254)/InGaAs 5.0 nm (256)

In this structure, the portion from the beginning to AlAs 251 of a thickness of 1.3 nm in the middle corresponds to active regions 210 and 230, and the portion from AlAs 251 of the thickness of 1.3 nm in the middle to the end corresponds to the relaxation region 220. In the relaxation region 220, n-InGaAs 254 of a thickness of 400 nm forms an almost continuous energy band 221. The n-InGaAs 254 is subjected to carrier doping to have an electron concentration of about $2 \times 10^{18}$ cm$^{-3}$ and to function as a collector of the previous active region 210 and an emitter of the next active region 230. The spacers 252 and 256 are layers for reducing segregation during carrier doping. The thickness of the relaxation region 220 is 410 nm. The frequency band of light (electromagnetic wave) is selected so that a half of the thickness of the relaxation region 220 is smaller than the skin depth of light (electromagnetic wave) emitted in the active region. The frequency is about 30 THz or less when electric conductivity of n-InGaAs 254 and the expression (3) are referred to.

In the configuration of the active regions 210 and 230, when an electric field of about 220 kV/cm is applied, a current having a current density of about 280 kA/cm$^2$ flows. Photon-assisted tunneling transition generates a gain up to about 600 cm$^{-1}$ within a frequency range of millimeter waves to terahertz waves (30 GHz to 30 THz). For a relationship between the photon-assisted tunneling transition and the gain, Jpn. J. Appl. Phys., Vol. 40, 5251 (2001) was referred to. Thus, at the above-mentioned 30 THz or less, the active regions 210 and 230 and the relaxation region 220 are well matched.

FIG. 2B is a structure section of the cascade laser device of this embodiment, illustrating a configuration example of a surface plasmon waveguide. Outside the active regions 210 and 230, electric contacts 261 and 262 that are negative permittivity media, negative permittivity clads 265 and 266, and electrodes 271 and 272 are disposed to constitute a surface plasmon waveguide. The electric contacts 261 and 262 are comprised of a semiconductor film of n-InAGaAs (thickness of 50 nm) that lattice-matches with an InP substrate. The electric contacts 261 and 262 are subjected to carrier doping to mainly function as emitters/collectors, and the electron concentration is set to $2 \times 10^{18}$ cm$^{-3}$. From this viewpoint, the electric contacts 261 and 262 constitute a carrier injecting portion. The negative permittivity media 265 and 266 are comprised of a semiconductor film of n-InGaAs (thickness of 100 nm) that lattice-matches with the InP substrate. The negative permittivity media 265 and 266 are subjected to carrier doping preferably with relatively high concentration to mainly function as negative permittivity clads for storing surface plasmon and, for example, the electron concentration is set to $1 \times 10^{19}$ cm$^{-3}$. In FIG. 2B, the InP substrate has been removed, and the epitaxial layer is transferred to the transfer substrate 21 to bring the negative permittivity media 265 and 266 into ohmic contact with electrodes 271 and 272 of Ti/Pd/Au etc.

Figure 7:
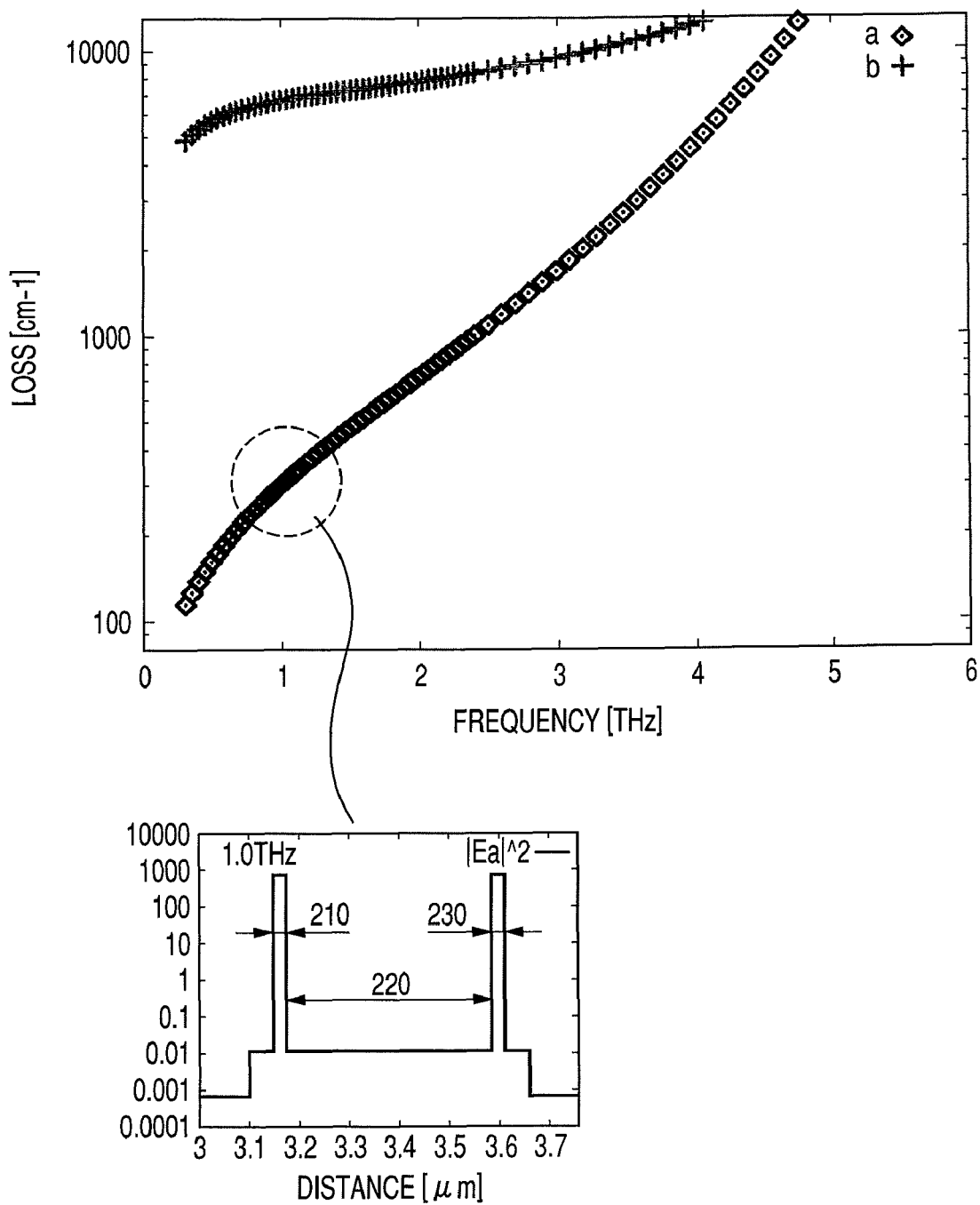
FIG. 7 illustrates an analysis example of an electromagnetic mode according to the second embodiment of the present invention.

FIG. 7 illustrates a result of modeling such an epitaxial layer direction one-dimensionally to perform calculation. FIG. 7 illustrates frequency dependences of mode losses of electromagnetic modes 'a' and 'b' of this embodiment and a profile of the electromagnetic mode 'a' at 1.0 THz. In a frequency range of FIG. 7, at 30 THz or less where the present invention can be applied, the active regions 210 and 230 are synchronized with each other to contribute only to the electromagnetic mode 'a', thereby enabling selection of the electromagnetic mode 'a' as an oscillation mode. The oscillation wavelength can be selected by an optical resonator structure which includes end surfaces in the surface plasmon waveguide. In this way, an oscillation wavelength of 30 THz or less, for example, 300 μm (1 THz), can be selected.

The cascade laser device of this embodiment can be manufactured by the following method.

First, the following layers are grown on an InP substrate by molecular beam epitaxy (MBE) or organic metal vapor epitaxy (MOVPE): n-InGaAs layers 266 and 262; an active region 230, a relaxation region 220, and an active region 210 of InGaAs/AlAs or InGaAs/InAlAs; and n-InGaAs layers 261 and 265. Ti/Pd/Au 271 is deposited as an electrode on the surface, and then the InP substrate is polished to be set to a thickness of about 120 μm. Then, the InP substrate is cleaved to a chip of about several hundred μm square to bond by pressing the electrode 271 with an Au thin film on a transfer substrate 21 on which a Ti/Au thin film or the like has been deposited. Heat fusion using solder such as AuSn may be also employed. Then, wet etching is carried out by hydrochloric acids to selectively remove the InP substrate. A mesa-shaped epitaxial layer is accordingly transferred to the transfer substrate 21.

Subsequently, the mesa shape as illustrated in FIG. 2B is formed by executing photolithography and dry etching until the substrate is exposed. This process enables formation of a striped waveguide resonator structure provided with a length of about several hundred μm and both ends formed as cleaved surfaces. After deposition of SiO$_2$ 22 by plasma CVD, the mesa-shaped epitaxial layer except the side wall is exposed. In this case, the side wall can be left by opening a window in a stripe shape by patterning followed by etching. Lastly, a Ti/Pd/Au electrode 272 is formed on the surface of the n-InGaAs layer 252 by a lift-off method to complete the configuration.

In this embodiment, as the surface plasmon waveguide having a resonator structure, as well-known in the semiconductor laser technology, a DBF type which modulates a stripe in a propagation direction or a DBR type configured by distributing reflection surfaces in the propagation direction can be employed. To reduce unmatching with the external space, as known in the optical technology, a configuration of an AR coating to apply coating by λ/4 from a tail end can be employed.

In this embodiment, the device can operate not only as the cascade laser device which produces laser oscillation but also as a cascade amplifying device and a cascade light emitting device. The device can operate as a photodetector. In this case, when a predetermined electric field is applied between electrodes as electric field applying portions, light of a wavelength determined by a multiple quantum well is absorbed in the stripe. When light is entered, a current flows to the multiple quantum well to become a photodetection signal. For example, the light is entered from a window formed excluding the electrode portion of the side wall. Other effects and features of this embodiment are almost similar to those of the first embodiment.

Third Embodiment

Figure 3A:
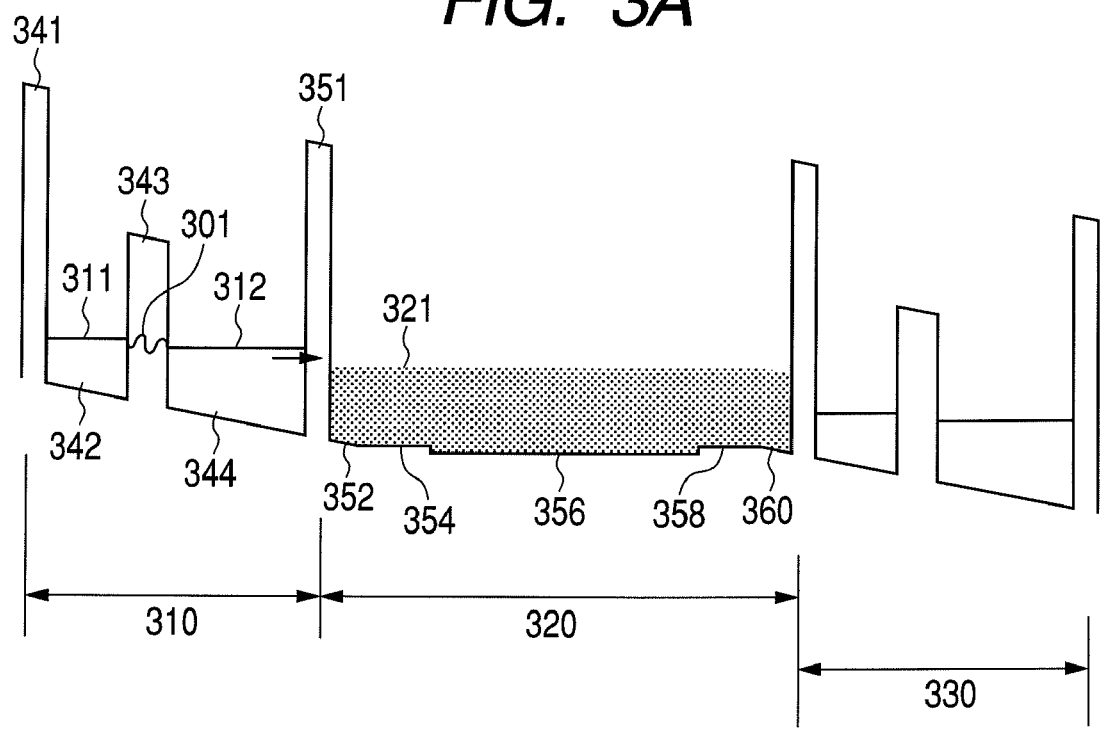
FIG. 3A illustrates a band profile of a conduction band structure of a cascade laser device according to a third embodiment of the present invention.
Figure 3B:
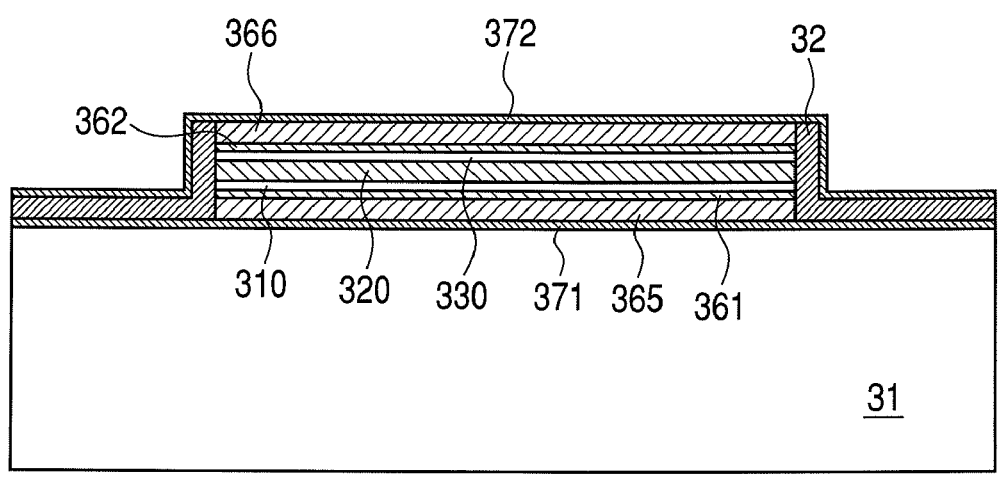
FIG. 3B illustrates a cross-sectional structure of the cascade laser device of the third embodiment of the present invention.
Figure 4:
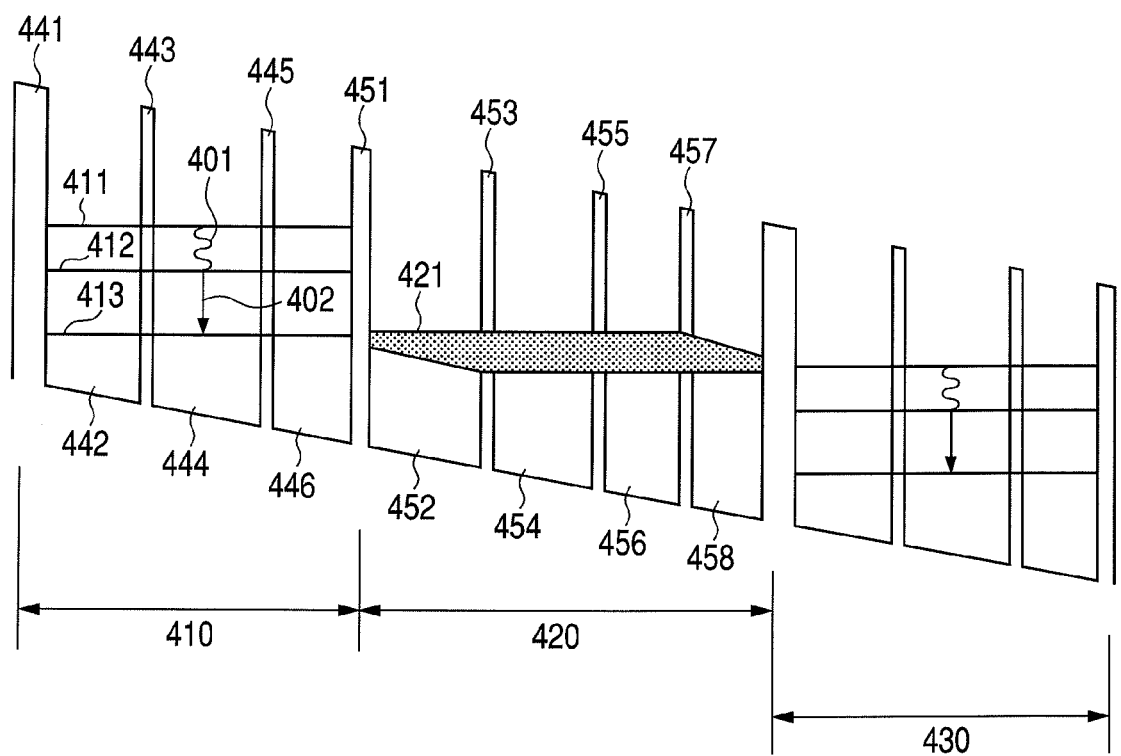
FIG. 4 illustrates an example of a band profile of a conduction band structure of a conventional quantum cascade laser device.

FIGS. 3A and 3B illustrate a cascade laser device according to a third embodiment of the present invention. FIG. 3A illustrates a conduction band structure of this embodiment, in which a relaxation region 320 includes a film 356 including no discrete sub-bands, electric contacts 354 and 358, and spacers 352 and 360. This configuration enables both of a function as an emitter/collector in the relaxation region 320 and reduction of mode losses effectively. Designing freedom can be enhanced more.

In this embodiment, a multilayer film structure is substantially the same as that of the first embodiment, and includes a semiconductor multilayer film structure which includes the following multiple quantum well. In the multiple quantum well, lattice-matching InGaAs on an InP substrate is used for the well layer, and a lattice-matching InAlAs or non lattice-matching AlAs is used for the barrier layer. Specifically, the respective layers form the following semiconductor multilayer film structure from the higher energy to the lower energy.

AlAs 1.3 nm (341)/InGaAs 5.6 nm (342)/InAlAs 2.6 nm (343)/InGaAs 7.6 nm (344)/AlAs 1.3 nm (351)/InGaAs 5.0 nm (352)/n-InGaAs 50 nm (354)/n-InGaAs 300 nm (356)/n-InGaAs 50 nm (358)/InGaAs 5.0 nm (360)

In the structure, the portion from the beginning to AlAs 351 of a thickness of 1.3 nm in the middle corresponds to active regions 310 and 330, and the portion from AlAs 351 of the thickness of 1.3 nm in the middle to the end corresponds to a relaxation region 320. In the relaxation region 320, n-InGaAs 356 of a thickness of 300 nm forms an almost continuous energy band 321. The n-InGaAs 354 and 358 are subjected to carrier doping to have an electron concentration of about $2 \times 10^{18}$ cm$^{-3}$ and to function as a collector of the previous active region 310 and an emitter of the next active region 330.

A difference from the second embodiment is n-InGaAs 356. This portion is different from the portion which functions as an emitter/collector, and can accordingly be designed simply to reduce mode losses.

The n-InGaAs 356 is subjected to carrier doping with high concentration, and the electron concentration is set to about $1 \times 10^{19}$ cm$^{-3}$, thereby reducing mode losses. Thus, the thickness of the relaxation region 320 is 410 nm. The frequency band of light (electromagnetic wave) is selected so that a half of the thickness can be smaller than the skin depth of light (electromagnetic wave) emitted in the active region, and set to about 9 THz or less by referring to the electric conductivity of n-InGaAs 356 and the expression (3). The active regions are similar in configuration to those of the second embodiment. Thus, at 9 THZ or less, the active regions 310 and 330 and the relaxation region 320 are matched.

Figure 8:
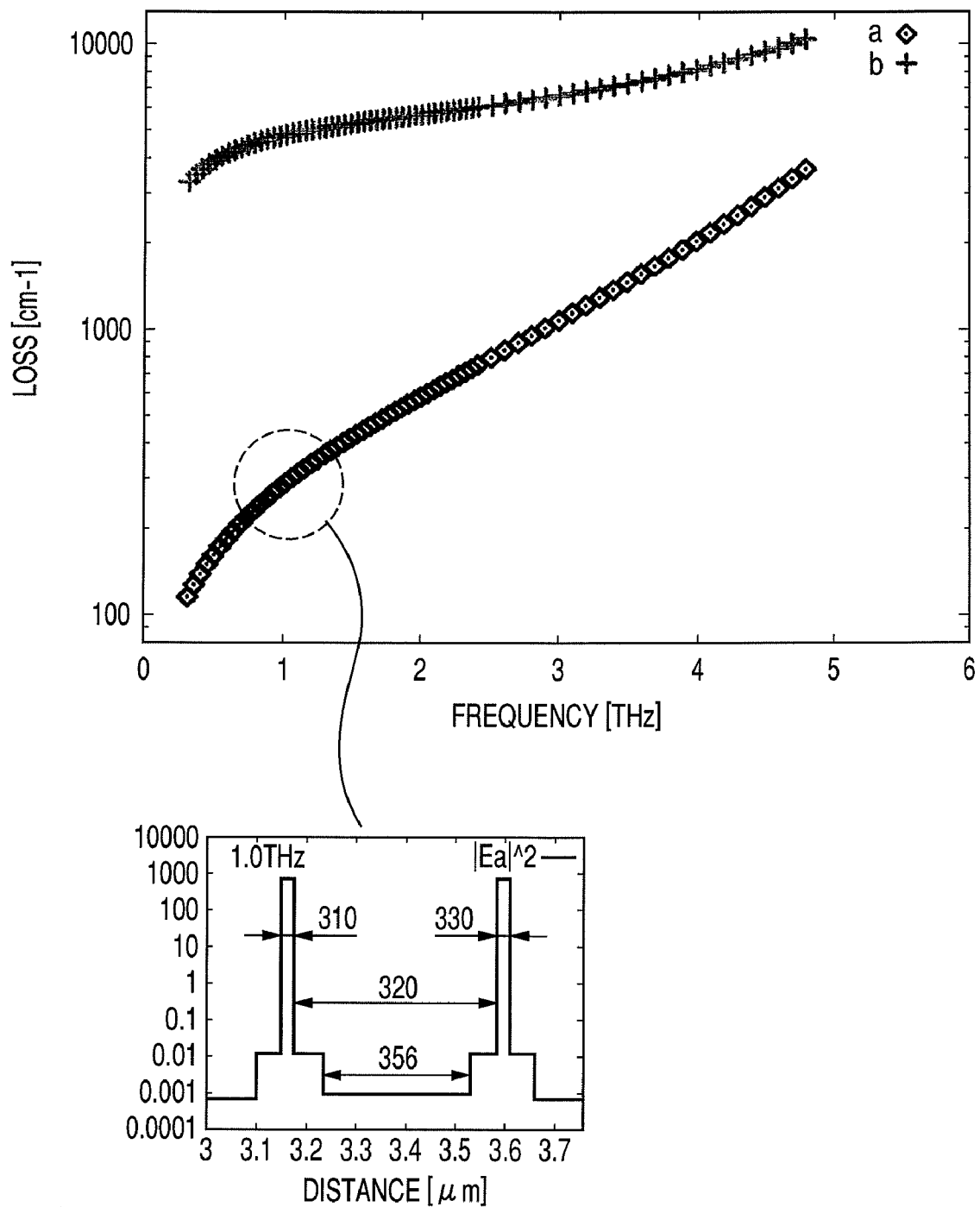
FIG. 8 illustrates an analysis example of an electromagnetic mode according to the third embodiment of the present invention.

FIG. 8 illustrates a result of modeling an epitaxial layer direction one-dimensionally to perform calculation as in the case of the second embodiment. FIG. 8 illustrates frequency dependences of mode losses of electromagnetic modes 'a' and 'b' of this embodiment, and a profile of the electromagnetic mode a at 1.0 THz or less. In a frequency band range of FIG. 8, at 9 THz or less in which the present invention can be applied, the active regions 310 and 330 are synchronized with each other to contribute to the electromagnetic mode 'a'. Hence, the electromagnetic mode 'a' can accordingly be selected as an amplifying mode. As a frequency band that enables amplification, for example, 0.3 THz to 1 THz can be selected.

In this embodiment, as a surface plasmon waveguide which forms a transmission structure, as well-known in the microwave technology, a λ/4 impedance converter may be disposed to reduce unmatching with the external space or an external transmission line. The waveguide may be tapered by λ/4 from a tail end (end surface). Other effects and features of this embodiment are almost similar to those of the aforementioned embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-156583, filed Jun. 16, 2008, which is hereby incorporated by reference in its entirety.

What is claimed is:

1. A cascade laser device, comprising:
    a multilayer film structure with a multiple quantum well including a potential barrier and a quantum well; and
    an electric field applying portion for applying an electric field to the multilayer film structure,
    wherein the multilayer film structure includes at least two first regions and a second region, the second region being sandwiched between the at least two first regions,
    wherein each of the at least two first regions includes multiple sub-bands, and, when the electric field is applied, carriers are transported from a sub-band in a higher energy quantum well to a sub-band in a lower energy quantum well via the potential barrier in the at least two first regions by tunneling permitted by interaction with light, and
    wherein the second region is thinner than twice a skin depth of the light and includes at least a film that is thicker than a de Broglie wavelength of the carriers and that has a continuous energy band, such that the carriers are subjected to energy relaxation in the continuous energy band.

2. A cascade laser device according to claim 1, wherein the film having the continuous energy band contains carriers.

3. A cascade laser device according to claim 1, wherein, when the electric field applying portion applies a predetermined electric field to the multiple quantum well, a current flows to the multiple quantum well, and a light is emitted or absorbed in the at least two first regions.

4. A cascade laser device according to claim 3, further comprising an optical resonator structure for resonating with the light emitted in the at least two first regions to produce laser oscillation.

5. A cascade laser device according to claim 3, wherein the multiple quantum well has a structure for absorbing light to perform light detection.

6. A cascade laser device according to claim 1, wherein the multilayer film structure has a structure in which the at least two first regions and the second region are repeated in order.

7. A cascade laser device according to claim 1,
    wherein the cascade laser device is incorporated in a cascade laser apparatus that includes a carrier injecting portion for injecting carriers to the cascade laser device, and
    wherein, when the electric field applying portion applies a predetermined electric field to the cascade laser device to inject carriers, a light is emitted or absorbed.

* * * * *